United States Patent [19]

Balde

[11] 4,168,876
[45] Sep. 25, 1979

[54] ELECTRICAL CONNECTOR STRUCTURES FOR FACILITATED SOLDER ATTACHMENT OF FLAT CONDUCTORS

[75] Inventor: John W. Balde, Raritan Township, Hunterdon County, N.J.

[73] Assignee: Western Electric Company, Inc., New York, N.Y.

[21] Appl. No.: 881,493

[22] Filed: Feb. 27, 1978

[51] Int. Cl.² .................. H01R 11/06; H05K 1/04
[52] U.S. Cl. ................ 339/176 MF; 29/628; 339/275 R
[58] Field of Search .......... 339/17 F, 176 MF, 275 R, 339/275 B, 275 T, 17 L, 176 MP; 29/628, 629

[56] References Cited

U.S. PATENT DOCUMENTS

| | | | |
|---|---|---|---|
| 2,483,424 | 10/1949 | Martines | 339/275 T |
| 3,002,176 | 9/1961 | Yopp | 339/176 |
| 3,015,083 | 12/1961 | Juris | 339/176 MP |
| 3,867,005 | 2/1975 | Hoppe, Jr. | 339/98 |
| 3,902,154 | 8/1975 | McKee | 339/223 R |
| 3,926,498 | 12/1975 | Hoppe, Jr. | 339/97 R |
| 3,950,070 | 4/1976 | Groft et al. | 339/176 MF |
| 4,035,049 | 7/1977 | McKee | 339/97 R |
| 4,040,702 | 8/1977 | McKee et al. | 339/97 R |
| 4,040,705 | 8/1977 | Huber | 339/99 R |
| 4,050,760 | 9/1977 | Cohen | 339/97 R |

FOREIGN PATENT DOCUMENTS

964839 7/1964 United Kingdom ............. 339/176 MP

OTHER PUBLICATIONS

Ribbon Connectors (Brochure RR-2), Ampenol Industrial Dev., Bunker-Ramo Corp., Chicago, Ill.
Interconnections for Telephone Systems, (Brochure TP-1) Ampenol Industrial Dev., Bunker-Ramo Corp., Chicago, Ill.

Primary Examiner—Neil Abrams
Attorney, Agent, or Firm—M. Pfeffer; A. S. Rosen

[57] ABSTRACT

An electrical connector is adapted for terminating a number of substantially flat conductors in a flat flexible cable, e.g., by soldering. The connector includes a number of contact members, each of which has a generally U-shaped portion with a substantially flat base. The contact members are so positioned within the recesses in a housing of the connector that the substantially flat bases of the generally U-shaped channel portions extend outwardmost from the interiors of the recesses, forming an outwardly-oriented, substantially planar surface to which the substantially flat conductors may readily be interconnected. By interchanging certain existing male and female contact members and inverting them from their previous attitudes within recesses in the housings of prior art connectors, such existing male and female contact members may be employed, with little or no change in their structures, in the new connector.

9 Claims, 6 Drawing Figures

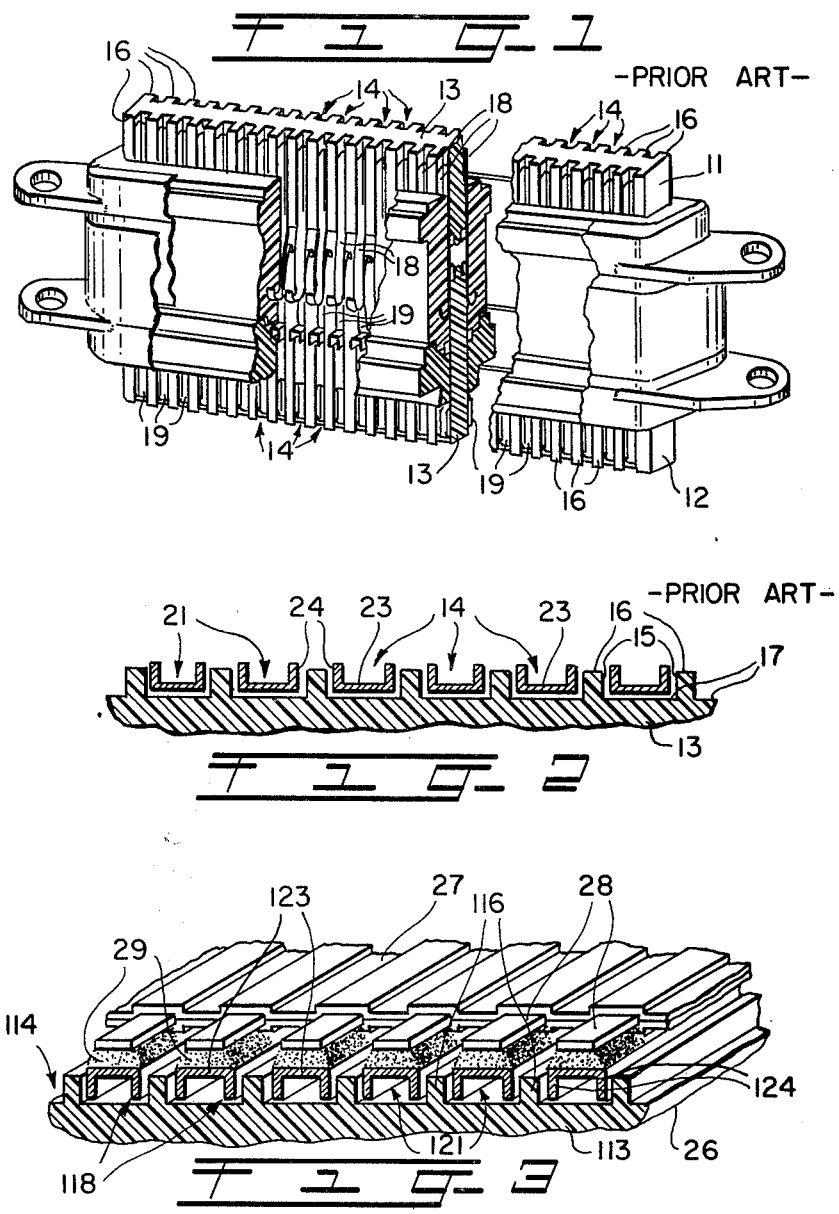

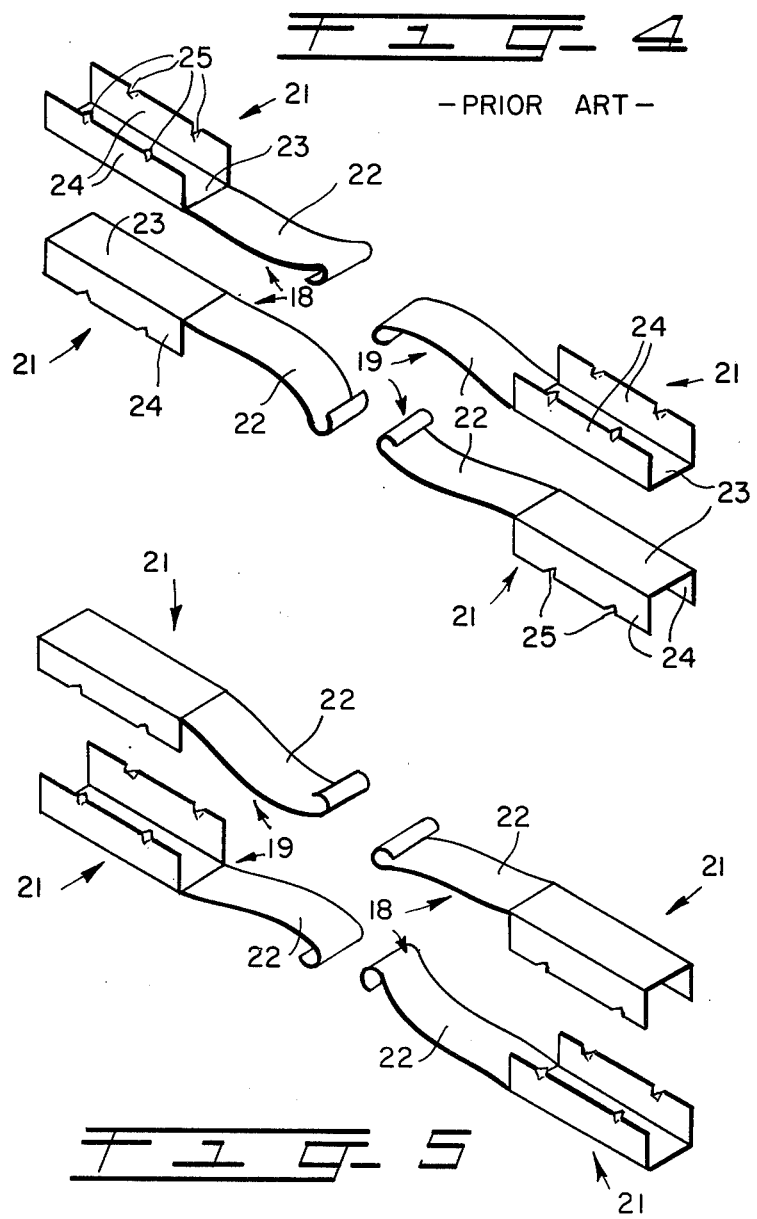

ELECTRICAL CONNECTOR STRUCTURES FOR FACILITATED SOLDER ATTACHMENT OF FLAT CONDUCTORS

BACKGROUND OF THE INVENTION

1. Field of the Invention

The invention relates to electrical connectors and, more particularly, to plural contact member, electrical connectors having their contact members so arranged as to facilitate interconnection with a plurality of substantially flat, electrical conductors in a flat flexible cable, as well as to methods of forming such electrical connectors, and to combined, interconnected, electrical connector and flat flexible cable structures.

2. Description of the Prior Art

Plural contact member, electrical connectors are well known. These connectors frequently utilize insulation-piercing contact members which include generally U-shaped channel portions for receiving and retaining insulated, round wire conductors, one in the generally U-shaped channel portion of each contact member. Such contact members have facilities in their generally U-shaped channel portions for piercing the insulation on each of the wires so as to make electrical contact therewith. Some examples of plural contact member, electrical connectors with insulation-piercing facilities are disclosed in U.S. Pat. Nos. 3,867,005 to P. P. Hoppe, Jr. and 4,050,760 to L. S. Cohen. Alternatively, such connectors may dispense with the insulation-piercing facilities and instead employ the generally U-shaped channel portions of their contact members as solder cups for receiving, and solder-retaining therein, insulation-free portions of the round wire conductors. Some examples of plural contact member, electrical connectors having contact members with generally U-shaped channel portions which serve as solder cups are disclosed in U.S. Pat. No. 3,002,176 to R. S. Yopp, and in two brochures, designated TP-1, and RR-2, prepared by the Amphenol Industrial Division of The Bunker-Ramo Corporation, Chicago, Ill.

A typical variety of prior art, plural contact member, electrical connector includes a housing, composed of a dielectric material, with a plurality of elongated recesses therein. Each contact member is disposed within a different, associated one of the recesses in the housing, with a substantially flat base of the generally U-shaped channel portion of the contact member, which joins two upstanding side walls of the generally U-shaped channel portion of the contact member, disposed extending inwardmost into the interior of the associated recess. Such contact member orientation is necessary in order to mount the contact member within the recess with the generally U-shaped channel portion of the contact member opening outwardly toward the exterior of the recess, so that a round wire conductor may thereafter be inserted into the open, generally U-shaped channel portion of the contact member, and either be received and retained by insulation-piercing facilities therein, or be retained in place by soldering.

Each contact member of a typical prior art, plural contact member, electrical connector also includes a curving contact element which extends principally axially away from the generally U-shaped channel portion along a major axis of the generally U-shaped channel portion. Two different general types of such contact members, the contact elements of which curve in different directions relative to the generally U-shaped channel portions, have most commonly been employed. A first type of contact member has been used for forming a male connector structure by the positioning of a plurality of such contact members, each within a different, associated recess in the connector housing with the previously described contact member orientation. This first type of contact member is characterized by a contact element which defines a curve with a major portion which is predominately convex in that direction along which the side walls of the generally U-shaped channel portion extend from the base of the generally U-shaped channel portion. A second type of contact member has been used for forming a female connector structure by the positioning of a plurality of such contact members, each within a different, associated recess in the connector housing with the previously described contact member orientation. This second type of contact member is characterized by a contact element which defines a curve with a major portion which is predominately concave along that direction in which the side walls of the generally U-shaped channel portion extend from the base of the generally U-shaped channel portion.

Prior art, plural contact member, electrical connectors of the previously described types are well suited for interconnection with a plurality of insulated, round wire conductors, since the individual wires may each readily be inserted into the U-shaped channel portion of a different contact member, and may thereupon be retained by any insulation-piercing facilities, or may thereupon be soldered in place, within the U-shaped channel portion. Such prior art connectors are, however, ill equipped to be interconnected to certain types of flat flexible cables which include substantially flat conductors, rather than round wires. Accordingly, it is evident that altered connector structures and connector forming methods are necessary where interconnection is desired between plural contact member, electrical connectors generally of the previously described, prior art types, and various flat flexible cables. Moreover, it would be most convenient if currently existing parts, such as the two, previously described, general types of contact members, could be included in the altered connector structures with little or no change in the configurations of the existing parts so included.

SUMMARY OF THE INVENTION

The invention contemplates plural contact member, electrical connectors with contact members which are so arranged as to facilitate interconnection with a plurality of substantially flat, electrical conductors in a flat flexible cable, as well as to methods of forming such electrical connector structures, and to combined, interconnected, electrical connector and flat flexible cable structures. An electrical connector according to the invention comprises a housing composed of a dielectric material and including a plurality of elongated recesses. Such connector further comprises a plurality of electrically conductive contact members, each associated with a different one of the recesses in the housing, each contact member including a generally U-shaped portion with a pair of upstanding side walls interconnected by a substantially flat base, the generally U-shaped channel portion of each contact member being received within the associated recess with an orientation which is inverted from the orientation of each contact member of the previously described, prior art, electrical connectors, in that the base of the generally U-shaped channel portion extends outwardmost from the interior of its recess. Thus, the substantially flat bases of the plurality of contact members form an outwardly-oriented, substantially planar surface to which the plurality of conductors of the flat flexible cable may readily be interconnected, e.g., by soldering. Moreover, by interchanging the previously mentioned first and second general types of prior art contact members in addition to inverting each contact member, the previously available male and female connector structures may be preserved with little or no change in the configurations of the contact members.

BRIEF DESCRIPTION OF THE DRAWING

FIG. 1 of the drawing is an isometric view of a mating pair of typical prior art, plural contact member, electrical connectors, one of the connectors being a male connector and the other being a female connector;

FIG. 2 is a horizontal sectional view through a portion of either of the two prior art connectors depicted in FIG. 1, illustrating the manner in which a plurality of contact members have previously been positioned, each in a different one of a plurality of recesses in a housing of the prior art male or female connector;

FIG. 3 is an isometric view of a segment of a connector manufactured in accordance with the principles of the invention, and of a partially stripped segment of a flat flexible cable to which the connector is interconnected, the connector being shown partly in section along a portion of the connector which corresponds to the portion of the prior art connector shown in FIG. 2, with FIG. 3 illustrating the manner in which a plurality of contact members are positioned, each in a different one of a plurality of recesses in a housing of a male or female connector according to the invention;

FIG. 4 is an isometric view of a set of four typical prior art contact members, two being of a type which has previously been used in the male connector of FIG. 1 and the other two being of a type which has previously been used in the female connector of FIG. 1;

FIG. 5 is an isometric view of a set of four contact members, which are identical to the prior art contact members shown in FIG. 4, but which are arrayed in an interchanged and inverted arrangement in accordance with the principles of the invention.

DETAILED DESCRIPTION

Figure 6:
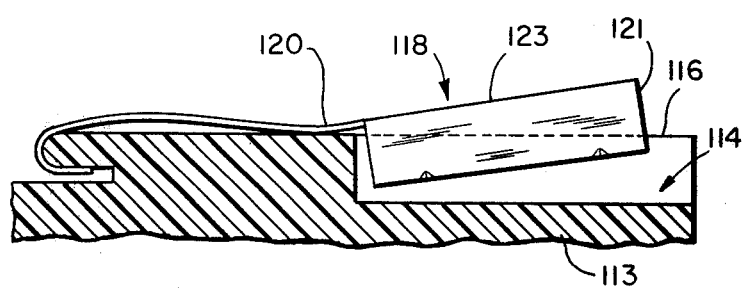
FIG. 6 is a partial, vertical sectional view of the connector of FIG. 3, illustrating the bending of portions of the contact members thereof to raise the bases of the contact members above the walls of the recesses in which the contact members are positioned.

Referring initially to FIG. 1 of the drawing, a mating pair of typical prior art, plural contact member, electrical connectors 11 and 12 is illustrated, connector 12 being a male connector or plug assembly and connector 11 being a female connector or receptacle assembly. Each connector, whether male or female, includes a housing 13 (see also FIG. 2) which is composed of a dielectric material, e.g., diallyl phthalate. A number of recesses 14,14 extend along the surface of each housing 13, with each recess 14 bordered along its opposite sides 15,15 (FIG. 2) by a pair of outwardly-extending wall portions 16,16. The recesses 14,14 of each housing 13 are arrayed along two parallel rows, and open outwardly in opposite directions, i.e., frontwardly and rearwardly in the illustration provided by FIG. 1, from a plane intermediate the two rows of recesses 14,14. Each recess 14 typically has a flat inner surface 17, as best seen in FIG. 2, with the outwardly-extending wall portions 16,16 which border the recess 14 extending perpendicularly to the flat inner surface 17.

Turning now to FIG. 4 of the drawing, a set of four typical prior art contact members 18,18,19,19 is illustrated. The contact members 18,18,19,19 are composed of an electrically conductive material, e.g., copper. The two contact members 18,18 are of a type which has previously been used in female connectors, such as the connector 11 of FIG. 1. The other two contact members 19,19 are of type which has previously been used in male connectors, such as the connector 12 of FIG. 1. The contact members 18,18 and 19,19 are shown in FIG. 4 in the orientations they would assume in a pair of prior art connectors 11 and 12 which are about to be mated as in FIG. 1. For clarity of illustration, the housings of the female connector 11, in which the contact members 18,18 would be mounted, and the male connector 12, in which the contact members 19,19 would be mounted, have been omitted from FIG. 4.

The prior art contact members 18,18 and 19,19 are similar in that each includes a generally U-shaped channel portion 21 for receiving a round wire conductor, and a curving contact element 22 which extends principally axially away from the generally U-shaped channel portion 21 along a major axis of the generally U-shaped channel portion 21. The generally U-shaped channel portion 21 of each contact member 18 or 19 has a substantially flat base 23 which interconnects a pair of upstanding side walls 24,24 surrounding the base 23. In addition, the generally U-shaped channel portion 21 of each contact member may have insulation-piercing facilities, such as jaws 25,25, for making contact, through an insulation covering, with a round wire conductor received within the generally U-shaped channel portion 21, and retaining the conductor therein. Alternatively, where the generally U-shaped channel portion 21 of the contact member 18 or 19 is to serve as a solder cup for receiving an insulation-free portion of a round wire conductor and solder-retaining the received wire portion, no insulation-piercing facilities are required.

The prior art contact members 18,18 and 19,19 differ in that their contact elements 22,22 curve in different directions relative to the generally U-shaped channel portions 21,21. Thus, as may clearly be seen in FIG. 4, the contact element 22 of each contact member 18 which has been used in a female connector defines a curve with a major portion which is predominately concave in that direction in which the side walls 24,24 of the generally U-shaped channel portion 21 of the contact member 18 extend away from the base 23 of the generally U-shaped channel portion 21. On the other hand, the contact element 22 of each contact member 19 which has been used in a male connector defines a curve with a major portion which is predominately convex in that direction in which the side walls 24,24 of the generally U-shaped channel portion 21 of the contact member 19 extend away from the base 23 of the generally U-shaped channel portion 21. The curved contact elements 22,22 of the contact members 12 and 13 are designed to engage one another with a wiping action as the male connector is inserted into the female connector. This wiping action serves to keep the contact elements 22,22 free of surface films and foreign matter.

Referring again to FIGS. 1 and 2 of the drawing, the manner in which the contact members 18,18 and 19,19 have previously been positioned in the housings 13,13 of the respective, prior art, female and male connectors 11 and 12, will next be described. As may be seen most clearly in FIG. 2, each contact member 18 or 19 is disposed within a different, associated one of the recesses 14,14 in the housing 13 of a connector 11 or 12 with the base 23 of the generally U-shaped channel portion 21 disposed extending inwardmost into the interior of the associated recess 14, along the flat inner surface 17 of the recess 14. It should be noted that the clearances observable between the adjacent surfaces of each generally U-shaped channel portion 21 and each recess 14 seen in FIG. 2 are present only for purposes of convenient illustration, and that, in fact, each generally U-shaped channel portion 21 is ordinarily inserted snugly into its respective recess 14.

The specific orientations of the contact members 18,18 and 19,19 in the housings 13,13 of the respective prior art connectors 11 and 12 shown in FIG. 2 are necessary in order to mount the contact members 18,18 and 19,19 within their recesses 14,14 with the generally U-shaped channel portion 21 of each contact member 18 or 19 opening outwardly toward the exterior of the associated recess 14, so that a round wire conductor may thereafter be inserted into the open, generally U-shaped channel portion 21 of the contact member 18 or 19, and either be received and retained by the jaws 25,25 if the contact member 18 or 19 is of the insulation-piercing variety, or be retained in place by soldering. The previously mentioned difference between the curvatures of the contact elements 22,22 of the contact members 18,18 and the curvatures of the contact elements 22,22 of the contact members 19,19 is particularly designed to cooperate with this prior art orientation of the contact members 18,18 and 19,19, providing a relative positioning of the various contact elements 22,22 in the housings 13,13 of the connectors 11 and 12 which, as may be seen in FIGS. 1 and 4, causes the connectors 11 and 12 to constitute, respectively, female and male connectors. It should be clear from viewing FIG. 2 that only the outwardmost tips of the side walls 24,24 of the generally U-shaped channel members 21,21 are available for connecting flat flexible cable to the contact members 18,18 or 19,19, and that any attempt so to connect flat flexible cable to the contact members 18,18 or 19,19 would be most difficult, and would produce, at best, a very fragile product.

A segment of a plural contact member, electrical connector 26 in accordance with the invention is illustrated in FIG. 3 of the drawing. The connector 26 is particularly well suited to interconnection, e.g., by soldering, with a partially stripped, flat flexible cable 27 having a number of substantially flat conductors 28,28. Of course, instead of having the insulation stripped from both sides of the flat flexible cable 27 in an interconnection area, as shown in FIG. 3, the insulation may be stripped from an inner side only of the flat flexible cable 27. The suitability for interconnection with the partially stripped, flat flexible cable 27 is afforded to the connector 26 by virtue of an inversion in the orientations of generally U-shaped channel portions 121,121 of a number of contact members 118,118 in respective recesses 114,114 of a housing 113, relative to the orientations of the generally U-shaped channel portions 21,21 of the contact members 18,18 and 19,19 in their respective recesses 14,14 in the housings 13,13 of the prior art connectors 11 and 12, as will next be explained more fully. It should be noted that elements of the connector 26 which correspond to similar elements of the connectors 11 and 12 are designated by corresponding reference numerals which are increased by a value of 100. It should also be noted that, insofar as the illustration of FIG. 3 is concerned, the contact members 118,118 might equally well be designated by reference numerals 119,119, in that the illustration of FIG. 3 is intended to correspond both to the use of the contact members 18,18 in a prior art female connector 11, and to the use of the contact members 19,19 in a prior art male connector 12.

The housing 113 of the connector 26 may be identical with the housing 13 of a prior art connector 11 or 12, being composed of any suitable dielectric material, such as diallyl phthalate, and providing a plurality of the elongated recesses 114,114. Each contact member 118 of the connector 26 is composed of any suitable electrically conductive material, such as copper, and, in similar manner to the contact members 18 and 19, includes both a generally U-shaped channel portion 121 and a contact element, which contact element is not shown in FIG. 3. The generally U-shaped channel portion 121 of each contact member 118 has a substantially flat base 123 which interconnects a pair of upstanding side walls 124,124 surrounding the base 123. The contact members 118,118 are each positioned within a different, associated one of the recesses 114,114 in the housing 113, with the generally U-shaped channel portion 121 of each contact member 118 having its base 123 extending outwardmost from the interior of the associated recess 114, rather than extending inwardmost into the interior of the associated recess 114 as in the prior art connectors 11 and 12. Thus, the substantially flat bases 123,123 of the number of the generally U-shaped channel portions 121,121 of the contact members 118,118 form an outwardly-oriented substantially planar surface, as may clearly be observed in FIG. 3, to which substantially planar surface the substantially flat conductors 28,28 of the flat flexible cable 27 may readily be interconnected, e.g., by elements of solder 29,29. Of course, outwardly-extending wall portion 116,116 of the housing 113 which border the recesses 114,114, must not extend outwardly far enough to intersect the substantially planar surface formed by the bases 123,123 of the contact members 118,118. This may, in some instances, require the slight modification of a prior art housing 13, if it is desired to adapt the prior art housing 13 for use as a housing 113 of a connector 118. Alternatively, since each contact element, such as the contact elements 18,18,19,19 which may be seen in FIG. 1, fits tightly into its housing, such as the prior art housing 13 of FIG. 1, a simple contact element bending operation may be all that is necessary. As seen in FIG. 6, by bending slightly the contact element of each contact member 118, as at 120, for example, prior to inserting the contact member 118 into the housing 113, the generally U-shaped channel portion 121 of the contact member 118 may be biased outwardly from the interior of its associated recess 114 to a degree sufficient to raise the base 123 of the generally U-shaped channel portion 121 above the level of the wall portions 116,116, thereby avoiding any need to modify the prior art housing 13.

It would be convenient, as noted previously, if the currently-available, contact members 18,18 and 19,19 could be employed, with little or no change in their configurations, in the connector 26, rather than having to fabricate contact members 118,118 of a different design. It may be noted, however, that any inversion of a prior art contact member 18 or 19, for use as a contact member 118 of a connector 26, will affect the previous scheme, illustrated in FIG. 4 of the drawing, for use of the contact member 18 or 19 in female or a male connector, respectively, due to a concomitant reorientation in the attitude of the contact element 22 of the contact member 18 or 19. In particular, upon the inversion of a contact member 18 or 19, the contact element 22 of the contact member 18 or 19 will curve in a direction opposite to that shown in FIG. 4.

Turning now to FIG. 5 of the drawing, a scheme is illustrated for utilizing inverted, prior art contact members 18,18 and 19,19 in connectors 26,26. A set of four contact members 18,18 and 19,19 is shown in FIG. 5, with the contact members 18,18 and 19,19 in the orientations which they would assume in a pair of connectors 26,26 which are about to be mated in similar manner to the mating of the prior art connectors 11 and 12 in FIG. 1. For clarity of illustration, the housings of a female connector, in which the contact members 19,19 would now be mounted, and a male connector, in which the contact members 18,18 would now be mounted, have been omitted from FIG. 5. As may be seen by comparing FIGS. 4 and 5, an interchange has taken place between the contact members 18,18 and 19,19. As a result of this interchange, the female character of a connector located toward the left in FIG. 4, and the male character of a connector located to the right in FIG. 4, have been preserved in the scheme of FIG. 5. In particular, the two upper contact members 18 and 19 of FIG. 4 have been interchanged and inverted, and the two lower contact members 18 and 19 of FIG. 4 have been interchanged and inverted, to provide the scheme of FIG. 5, which represents an appropriate arrangement of the contact members 18,18 and 19,19 for use as contact members 118,118 in a pair of mating connectors 26,26 of the type of the invention.

In many instances the prior art contact members 18 and 19 may be used without modification in the connectors 26,26 of the invention, in accordance with the scheme of FIG. 5. In some cases, however, where, for example, bent tangs have been used for retaining the contact members 18 and 19 in their respective recesses 14,14, minor modifications may be required to the contact members 18 and 19. Alternatively, separate sets of contact members 118,118 of suitable configurations may be manufactured for use in the connectors 26,26 of the invention. If the prior art contact members 18,18 and 19,19 are to be used in the connectors 26,26 of the invention, it is, of course, immaterial whether any such contact member 18 or 19 includes or does not include insulation-piercing facilities such as the jaws 25,25.

It is to be understood that the described connectors and methods of forming connectors and are simply illustrative of preferred embodiments of the invention. Many modifications may, of course, be made in accordance with the principles of the invention.

What is claimed is:

1. A plural contact member, electrical connector for terminating a plurality of conductors in a flat flexible cable, the connector comprising:
   a housing composed of a dielectric material and including a plurality of elongated recesses arranged in two parallel, back-to-back rows with the recesses of each row opening outwardly and in an opposite direction from the recesses of the other row; and
   a plurality of electrically conductive contact members, each associated with a different one of said recesses in said housing, each contact member including a generally U-shaped channel portion with a pair of upstanding side walls interconnected by a substantially flat base, said generally U-shaped channel portion of each contact member terminating in a free end and being received within the associated recess with the free end being substantially coextensive with one end of the associated recess and with the base of the generally U-shaped channel portion positioned extending outwardmost from the interior of the recess, so that the contact members are arranged in two parallel rows with the generally U-shaped channel portions of the contact member of each row opening inwardly of the housing towards the generally U-shaped channel portions of the contact members of the other row, and with the bases of the contact members of each row facing outwardly and in opposite directions from the bases of the contact members of the other row, the substantially flat bases of the plurality of contact members forming two, parallel, outwardly-oriented, substantially planar surfaces to which the plurality of conductors of the flat flexible cable may readily be interconnected.

2. A connector as set forth in claim 1, further comprising:
   means biasing said generally U-shaped channel portion of each contact member outwardly from the interior of its associated recess in said housing.

3. A connector as set forth in claim 2, wherein said biasing means comprises:
   a curving contact element, forming a portion of each contact member remote from said generally U-shaped channel portion thereof, engaging a portion of said housing.

4. A combined electrical connector and flat flexible cable structure comprising:
   a housing, composed of a dielectric material and including a plurality of elongated recesses;
   a plurality of electrically conductive contact members, each associated with a different one of said recesses in said housing, each contact member including a generally U-shaped channel portion with a pair of upstanding side walls interconnected by a substantially flat base, said generally U-shaped channel portion of each contact member being so received within the associated recess, with the base of the generally U-shaped channel portion positioned extending outwardmost from the interior of the recess, that the substantially flat bases of the plurality of contact members form an outwardly-oriented, substantially planar surface; and
   a flat flexible cable having a plurality of electrical conductors each interconnected with a different, associated one of said plurality of contact members along said outwardly-oriented, substantially planar surface.

5. A combined structure as set forth in claim 4, comprising:
   a body of solder providing the interconnection between each conductor of said cable and its associated contact member.

6. A combined structure as set forth in claim 4, further comprising:
   a curving contact element, forming a portion of each contact member remote from said generally U- shaped channel portion thereof, so engaging a portion of said housing as to bias said generally U-shaped channel portion outwardly from the interior of its associated recess.

7. A method of forming a plural contact member, electrical connector, the connector comprising a housing which is composed of a dielectric material and which includes a plurality of elongated recesses, said recesses being arrayed along two parallel rows of recesses, and opening outwardly in opposite directions from a plane intermediate the two rows of recesses, the connector further comprising a plurality of electrical contact members, each located in a different, associated one of said recesses in said housing, each contact member including a generally U-shaped channel portion with a pair of upstanding side walls interconnected by a substantially flat base, each contact member including a contact element extending principally axially from the generally U-shaped channel portion along a major axis of the generally U-shaped channel portion while defining a curve with a major portion which is predominately concave in that direction along which the side walls of the generally U-shaped channel portion extend away from the base of the generally U-shaped channel portion, the method comprising the step of:

positioning each of said contact members within a different, associated one of the recesses in the housing, with the base of the generally U-shaped channel portion disposed extending outwardmost from the interior of the associated recess to thereby form a male connector structure.

8. A method of forming a plural contact member, electrical connector, the connector comprising a housing which is composed of a dielectric material and which includes a plurality of elongated recesses, said recesses being arrayed along two parallel rows of recesses, and opening outwardly in opposite directions from a plane intermediate the two rows of recesses, the connector further comprising a plurality of electrical contact members, each located in a different, associated one of said recesses in said housing, each contact member including a generally U-shaped channel portion with a pair of upstanding side walls interconnected by a substantially flat base, each contact member including a contact element extending principally axially from the generally U-shaped channel portion along a major axis of the generally U-shaped channel portion while defining a curve with a major portion which is predominately concave in that direction along which the side walls of the generally U-shaped channel portion extend away from the base of the generally U-shaped channel portion, the method comprising the step of:

positioning each of said contact members within a different, associated one of the recesses in the housing, with the base of the generally U-shaped channel portion disposed extending outwardmost from the interior of the associated recess to thereby form a female connector structure.

9. A method as set forth in claims 7 or 8, further comprising a preliminary step of:

so forming a portion of each of the contact members remote from the generally U-shaped channel portion of the contact member, which remote portion will engage the housing upon performance of said positioning step, that, upon such performance of said positioning step, the generally U-shaped portion of the contact member will be biased outwardly from the interior of its associated recess.

* * * * *

UNITED STATES PATENT AND TRADEMARK OFFICE
CERTIFICATE OF CORRECTION

PATENT NO. : 4,168,876

DATED : September 25, 1979

INVENTOR(S) : John W. Balde

It is certified that error appears in the above—identified patent and that said Letters Patent is hereby corrected as shown below:

In the drawing, sheet 2, FIG. 4, the hook-shaped ends of the contact element 22 of the contact members 18, should appear as follows:

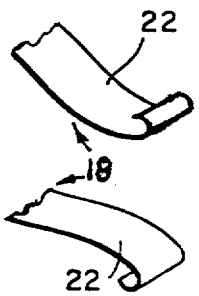

UNITED STATES PATENT AND TRADEMARK OFFICE
CERTIFICATE OF CORRECTION

PATENT NO. : 4,168,876

DATED : September 25, 1979

INVENTOR(S) : John W. Balde

It is certified that error appears in the above—identified patent and that said Letters Patent is hereby corrected as shown below:

In the drawing, sheet 2, FIG. 5, the hook-shaped ends of the contact element 22 of the contact members 18, should appear as follows:

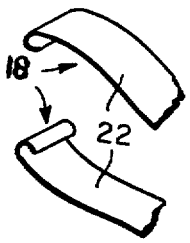

Signed and Sealed this

Fifteenth Day of April 1980

[SEAL]

Attest:

SIDNEY A. DIAMOND

Attesting Officer

Commissioner of Patents and Trademarks